(12) United States Patent
Zeng et al.

(10) Patent No.: US 12,727,254 B2
(45) Date of Patent: Sep. 1, 2026

(54) ELECTROSTATIC DEVICE

(71) Applicant: GlobalFoundries Singapore Pte. Ltd., Singapore (SG)

(72) Inventors: Jie Zeng, Singapore (SG); Kyong Jin Hwang, Singapore (SG); Namchil Mun, Singapore (SG); Shiang Yang Ong, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 826 days.

(21) Appl. No.: 18/096,811

(22) Filed: Jan. 13, 2023

(65) Prior Publication Data

US 2024/0243118 A1 Jul. 18, 2024

(51) Int. Cl.

| | |
|---|---|
| ***H01L 23/62*** | (2006.01) |
| ***H10D 62/10*** | (2025.01) |
| ***H10D 84/01*** | (2025.01) |
| ***H10D 84/03*** | (2025.01) |
| ***H10D 89/60*** | (2025.01) |

(52) U.S. Cl.

CPC ........... *H10D 89/60* (2025.01); *H10D 62/115* (2025.01); *H10D 84/0112* (2025.01); *H10D 84/038* (2025.01)

(58) Field of Classification Search

CPC .. H10D 89/60; H10D 62/115; H10D 84/0112; H10D 84/038; H10D 10/00; H10D 62/137; H10D 64/115; H10D 89/711; H01L 21/76202; H01L 21/76224

USPC ........................................................ 257/355

See application file for complete search history.

(56) References Cited

U.S. PATENT DOCUMENTS

| | | | | |
|---|---|---|---|---|
| 5,011,784 | A | 4/1991 | Ratnakumar | |
| 6,159,784 | A * | 12/2000 | Ammo | H10D 84/038 438/234 |
| 6,472,286 | B1 | 10/2002 | Yu | |
| 7,968,936 | B2 | 6/2011 | Denison et al. | |
| 8,878,283 | B2 | 11/2014 | Denison et al. | |
| 9,018,705 | B2 | 4/2015 | Hwang | |
| 9,673,084 | B2 | 6/2017 | Liu et al. | |
| 10,529,812 | B1 | 1/2020 | Edwards | |
| 11,302,687 | B2 | 4/2022 | Zeng et al. | |
| 2006/0121667 | A1* | 6/2006 | Bae | H10D 84/0109 257/E21.696 |

(Continued)

FOREIGN PATENT DOCUMENTS

| | | |
|---|---|---|
| TW | I500156 | 9/2015 |
| TW | I563661 | 12/2016 |

OTHER PUBLICATIONS

Partial European Search Report and Opinion dated May 17, 2024 in EP Application No. 23214858.5-1001, 11 pages.

(Continued)

*Primary Examiner* — Theresa T Doan

(74) *Attorney, Agent, or Firm* — Francois Pagette; Andrew M. Calderon; Calderon Safran & Wright P.C.

(57) ABSTRACT

The present disclosure relates to semiconductor structures and, more particularly, to electrostatic devices and methods of manufacture. The structure includes: a device having a collector, an emitter, and a base; an isolation structure extending between the base and the collector; a high resistivity film over the isolation structure; and a silicide blocking layer partially covering the high resistivity film, the isolation structure and the collector.

12 Claims, 5 Drawing Sheets

(56) References Cited

U.S. PATENT DOCUMENTS

| | | | |
|---|---|---|---|
| 2010/0171149 | A1 | 7/2010 | Denison et al. |
| 2012/0241900 | A1 | 9/2012 | Chen et al. |
| 2013/0187231 | A1 | 7/2013 | Lai et al. |
| 2014/0042544 | A1 | 2/2014 | Karno |
| 2014/0197491 | A1 | 7/2014 | Yamaj |
| 2014/0225156 | A1 | 8/2014 | Zhan et al. |
| 2014/0264576 | A1 | 9/2014 | Zhang et al. |
| 2014/0353799 | A1 | 12/2014 | Hwang |
| 2015/0048451 | A1 | 2/2015 | Chan |
| 2016/0163583 | A1 | 6/2016 | Liu et al. |
| 2018/0247928 | A1 | 8/2018 | Lai et al. |
| 2018/0286853 | A1 | 10/2018 | Mallikarjunaswamy |
| 2018/0315641 | A1 | 11/2018 | Kalnitsky et al. |
| 2018/0323184 | A1 | 11/2018 | Hung et al. |
| 2019/0103396 | A1 | 4/2019 | Zhan et al. |
| 2019/0103498 | A1 | 4/2019 | Pang et al. |
| 2019/0189786 | A1 | 6/2019 | Zhu et al. |
| 2019/0259829 | A1 | 8/2019 | Mun et al. |
| 2020/0091341 | A1 | 3/2020 | Iwatsu et al. |
| 2020/0403103 | A1 | 12/2020 | Pjencak et al. |
| 2021/0082905 | A1* | 3/2021 | Zeng .................... H10D 89/713 |
| 2021/0134787 | A1 | 5/2021 | Zeng et al. |
| 2023/0085420 | A1 | 3/2023 | Mahajan et al. |

OTHER PUBLICATIONS

The Extended European Search Report and Opinion dated Jul. 25, 2024 in EP Application No. 23214858.5-1001, 12 pages.

Cha et al., “0.18μm 100V-rated BCD with Large Area Power LDMOS with ultra-low effective Specific Resistance”, IEEE, Proceedings of the 2016 28th International Symposium on Power Semiconductor Devices and ICs (ISPSD), Jun. 12-16, 2016, 4 pages.

The Extended Search Report and Opinion dated Nov. 19, 2024 in EP Application No. 24181277.5-1001 9 pages.

A. Gendron et al., “Area-Efficient, Reduced and No. Snapback PNP-based ESD Protection in Advanced Smart Power Technology”, Electrical Overstress/Electrostatic Discharge Symposium, 2006, IEEE, Abstract, 3 pages.

Hanseob Cha et al., “0.18μm 100V-rated BCD with Large Area Power LDMOS with ultra-low effective Specific Resistance”, Proceedings of 2016 28th International Symposium on Power Semiconductor Devices and ICs (ISPSD), Jun. 2016, pp. 423-426, IEEE, 4 pages.

P. Renaud et al., “High robustness PNP-based structure for the ESD protection of high voltage I/Os in an advanced smart power technology”, Bipolar/BiCMOS Circuits and Technology Meeting, 2007, IEEE, Abstract, 3 pages.

R. Zhu et al., “Implementation of High-Side, High-Voltage RESURF LDMOS in a sub-half Micron Smart Power Technology”, Proceedings of 2001 International Symposium on Power Semiconductor Devices & ICs, 2001, IEEE, Abstract, 3 pages.

V. Khemka et al., “A Floating RESURF (FRESURF) LD-MOSFET Device Concept”, IEEE Electron Device Letters, Oct. 2003, vol. 24, No. 10, IEEE, Abstract, 3 pages.

Foreign Office Action dated Oct. 30, 2025 in KR Application No. 10-2024-0169676, 14 pages.

* cited by examiner

ELECTROSTATIC DEVICE

BACKGROUND

The present disclosure relates to semiconductor structures and, more particularly, to electrostatic devices and methods of manufacture.

For more efficient power delivery in electric systems such as an electric vehicle, operation voltage is becoming higher and higher. And as integrated circuits continue to shrink in size, they become more sensitive to electrostatic discharge. This high voltage usage and continued scaling of devices require an electrostatic device (ESD) protection device with the capability of sustaining such high voltage with sufficient enough robustness in a small footprint.

Conventionally, a method of stacking low voltage ESD devices have been used to achieve high voltage operation capability. But the stacking method multiplies the ESD device footprint by the stacking number. Also, the use of multiple ESD devices results in an increased turn-on resistance.

SUMMARY

In an aspect of the disclosure, a structure comprises: a device comprising a collector, an emitter, and a base; an isolation structure extending between the base and the collector; a high resistivity film over the isolation structure; and a silicide blocking layer partially covering the high resistivity film, the isolation structure and the collector.

In an aspect of the disclosure, a structure comprises: a device comprising a collector within a P-drift region, an emitter spanning a gap in a N-drift region abutting the P-drift region, and a base within the N-drift region; a first deep trench isolation structure touching the P-drift region and extending into an underlying substrate below a buried layer of semiconductor material; and a second deep trench isolation structure extending into the underlying substrate below the buried layer of the semiconductor material.

In an aspect of the disclosure, a method comprises: forming a device comprising a collector, an emitter, and a base; forming an isolation structure extending between the base and the collector; forming a high resistivity film over the isolation structure; and forming a silicide blocking layer partially covering the high resistivity film, the isolation structure and the collector.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to electrostatic devices and methods of manufacture. More specifically, the present disclosure relates to high voltage electrostatic device (ESD) protection devices. In embodiments, the high voltage ESD protection devices comprise a high voltage PNP bipolar transistor with deep trench isolation structures and a unique surface structure for high voltage operation. Advantageously, the high voltage ESD protection devices exhibit a small footprint which can sustain high voltage operation, e.g., more than 120V voltage operation, in addition to exhibiting a small turn-on resistance.

The electrostatic devices of the present disclosure can be manufactured in a number of ways using a number of different tools. In general, though, the methodologies and tools are used to form structures with dimensions in the micrometer and nanometer scale. The methodologies, i.e., technologies, employed to manufacture the electrostatic devices of the present disclosure have been adopted from integrated circuit (IC) technology. For example, the structures are built on wafers and are realized in films of material patterned by photolithographic processes on the top of a wafer. In particular, the fabrication of the electrostatic devices uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1A:
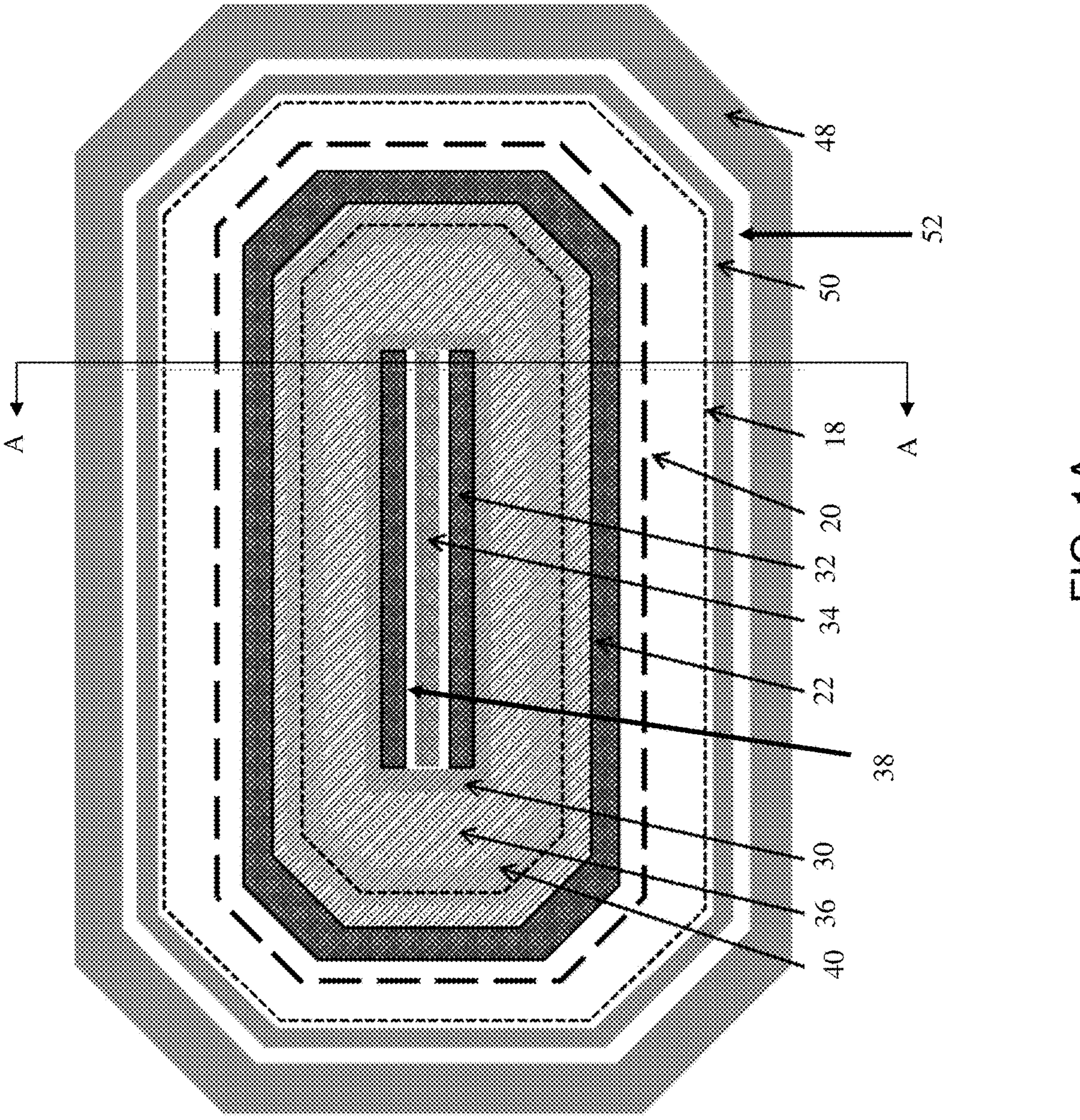
FIG. 1A shows a top view of a high voltage electrostatic device (ESD) protection device, amongst other features, and respective fabrication processes in accordance with aspects of the present disclosure.
Figure 1B:
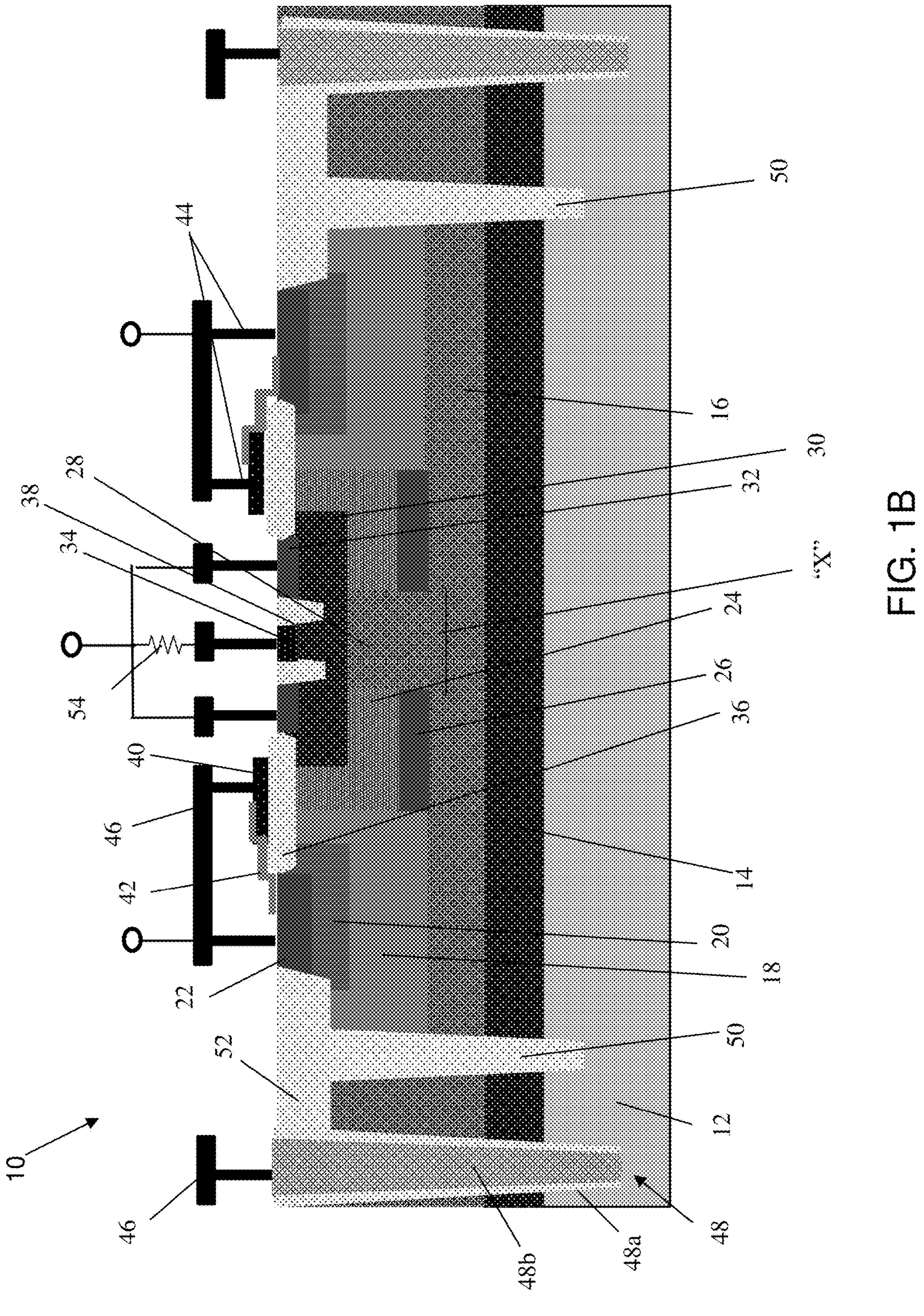
FIG. 1B shows a cross-sectional view of the high voltage ESD protection device of FIG. 1A along line A-A.

FIG. 1A shows a top view of a high voltage electrostatic device (ESD) protection device, amongst other features, and respective fabrication processes in accordance with aspects of the present disclosure. FIG. 1B shows a cross-sectional view of the high voltage ESD protection device of FIG. 1A along line A-A. In embodiments, the ESD protection device 10 may be a PNP transistor with a unique surface structure and deep trench isolation structures.

Referring to FIGS. 1A and 1B, the high voltage ESD protection device 10 includes a semiconductor substrate 12. In embodiments, the semiconductor substrate 12 may be a bulk substrate or a semiconductor on insulator (SOI) substrate. The semiconductor substrate 12 may be composed of any suitable semiconductor material including, but not limited to, Si, SiGe, SiGeC, SiC, GaAs, InAs, InP, and other III/V or II/VI compound semiconductors. In more specific embodiments, the semiconductor substrate 12 may be a p-type Si substrate with a single crystalline orientation, e.g., a (100), (110), (111), or (001) crystallographic orientation.

Still referring to FIGS. 1A and 1B, an N-type layer 14 may be formed in the semiconductor substrate 12. In embodiments, the N-type layer 14 may be a buried N+ layer formed by an ion implantation process. As with any of the implanted regions described herein (e.g., drift regions, wells, buried implant layers, diffusion regions, etc.), an ion implantation process can be implemented which includes introducing a concentration of a dopant of different conductivity type in the semiconductor substrate 12 (or semiconductor material 16).

For example, implanted regions may be formed by using a patterned implantation mask to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. An N-type dopant may be e.g., Arsenic (As), Phosphorus (P) and Antimony (Sb), among other suitable examples. A P-type dopant may be, e.g., Boron (B). An annealing process, e.g., rapid thermal anneal as is known in the art, may be performed to drive in the dopant into the semiconductor substrate 12 (and semiconductor material 16).

FIGS. 1A and 1B further show a semiconductor material 16 formed on the N-type layer 14. In embodiments, the semiconductor material 16 may be an N-type semiconductor material epitaxially grown on the N-type layer 14. In more specific embodiments, the semiconductor material 16 may be an epitaxially grown Si material with an in-situ N-type doping process as is known in the art such that no further explanation is required for a complete understanding of the present disclosure. The semiconductor material 16 may be any appropriate semiconductor material such as, e.g., Si; although other examples are also contemplated herein.

A drift region 18 may be formed in the semiconductor material 16. In embodiments, the drift region 18 may be a P-type drift region that extends to a surface of the semiconductor material 16. In embodiments, the drift region 18 may be above the N-type layer 14, e.g., separated from and not contacting the N-type semiconductor layer 14. A P-well 20 may be formed in the drift region 18, with a P+ diffusion region 22 formed within the P-well 20. As noted above, the drift region 19, p-well 20 and P+ diffusion region 22 may be formed using respective ion implantation processes. Also, as should be understood by those of skill in the art, the P+ diffusion region 22 may be a collector region of a bipolar junction transistor, which may be biased to ground (GND).

An N-type drift region 24 may be formed in the semiconductor material 16, adjacent to the drift region 18. In embodiments, the N-type drift region 24 extends to a surface of the semiconductor material 16. In further embodiments, the N-type drift region 24 may be above the N-type layer 14, e.g., separated from and not contacting the N-type layer 14. A P+ buried layer 26 may be formed below the N-type drift region 24 within the semiconductor material 16. As noted above, the N-type drift region 24 and the P+ buried layer 26 may be formed using respective ion implantation processes.

In embodiments, a gap 28 may be provided between the opposing sides of the N-type drift region 24 and P+ buried layer 26. The gap 28 may be filled with the semiconductor material 16 and may have a tunable distance "X". For example, a smaller distance "X" may result in a higher breakdown voltage.

An N-well 30 may be formed in the semiconductor material 16, spanning the gap 28 between the N-type drift region 24. In embodiments, the N-well 30 overlaps with the N-type drift region 24. P+ diffusion regions 32 may be formed in the N-well 30, with an N+ diffusion region 34 between the P+ diffusion regions 32. In embodiments, the P+ diffusion regions 32 may be an emitter of the bipolar junction transistor. Also, as should be understood by those of skill in the art, the N-well 30 (with N+ diffusion 34) may be a base of the bipolar junction transistor. The base, e.g., N-well 30, may connect to the emitter (P+ diffusion regions 32) through a base resistor 54.

An isolation structure 36 may be provided between the P+ diffusion regions 22, 32. In embodiments, the isolation structure 36 may overlap the drift regions 18, 24 and extend into the N-well 30. The isolation structure 36 may be a LOCOS (LOCal Oxidation of Silicon) or shallow trench isolation structure, each of which exhibits a minimum length. The LOCOS may be a raised oxide region. As should be understood by those of skill in the art, the LOCOS process utilizes the different rates of oxidation of silicon and local masking of silicon nitride. The silicon nitride masks regions where no oxidation should occur such that the oxide only growths on the bare semiconductor material 16.

Moreover, shallow trench isolation structures 38 may be formed between the P+ diffusion regions 32 and the N+ diffusion region 34. In addition, shallow trench isolation structures 52 may be formed in the semiconductor material 16, adjacent to the diffusion regions 22 and extending into the drift region 18. The shallow trench isolation structures 38, 52 may be formed by conventional lithography, etching and deposition processes. For example, a resist formed over the semiconductor material 16 is exposed to energy (light) and developed to form a pattern (opening). An etching process with a selective chemistry, e.g., reactive ion etching (RIE), will be used to transfer the pattern from the patterned photoresist to the semiconductor material 16 to form one or more trenches in the semiconductor material 16 (e.g., N-well 30 and partially within the drift region 18 of the semiconductor material 16) through the openings of the resist. Following the resist removal by a conventional oxygen ashing process or other known stripants, the insulator material (e.g., oxide) can be deposited by any conventional deposition processes, e.g., chemical vapor deposition (CVD) processes. Any residual material on the surface of the semiconductor material 16 can be removed by conventional chemical mechanical polishing (CMP) processes.

A high resistivity film 40 (e.g., polysilicon field plate) may be formed on the isolation structure 36. In embodiments, the high resistivity film 40 may be a polysilicon material that is deposited and patterned on the isolation structure 36. As should be understood by those of skill in the art, the P+ diffusion region 22 (collector) and the high resistivity film 40 may be biased to ground (GND) (via connection by metal plate 46) to reduce a surface electric field and make the surface electric field more uniform to sustain a high breakdown voltage. Also, as should be understood by those of skill in the art, the P+ diffusion region 22 and the high resistivity film 40 will provide a high current conducting capability.

A silicide blocking layer 42 may be formed on the isolation structure 36 and, more specifically, extending from a top surface of the high resistivity film 40 to a surface of the P+ diffusion regions 22. In more specific embodiments, the silicide blocking layer 42 partially covers the collector terminal (e.g., P+ diffusion regions 22), the isolation structure 36 and the high resistivity film 40. The silicide blocking layer 42 will prevent silicide formation, in addition to blocking current to allow for a more uniform electric field on the surface. In embodiments, the high resistivity film 40 may be connected to the collector, e.g., P+ diffusion region 22, by via contacts 44 and metal plate 46 (e.g., metal field plate). As should be understood by those of skill in the art, the ESD protection device comprises a PNP device with a reduced surface field (RESURF) structure composed of the metal field plate 46, the high resistivity film 40, the isolation structure 36, the drift region 24 and P+ buried layer 26, all of which allows sustaining of high breakdown voltage.

The contacts 44 and metal plates 46 may be formed to the diffusion regions 22, 32, 34 and deep trench isolation structures 48. Prior to forming of the contacts 44 and metal plates 46, a silicide process can be provided on exposed semiconductor material, e.g., regions 22, 32, 34 and the high resistivity film 42. As noted above, the silicide blocking layer 42 will prevent silicide formation at certain locations of the structure.

As should be understood by those of skill in the art, the silicide process begins with deposition of a thin transition metal layer, e.g., nickel, cobalt or titanium, over fully formed and patterned semiconductor material (e.g., doped or ion implanted regions). After deposition of the material, the structure is heated allowing the transition metal to react with exposed silicon (or other semiconductor material as described herein) in the active regions forming a low-resistance transition metal silicide. Following the reaction, any remaining transition metal is removed by chemical etching, leaving silicide contacts in the active regions of the device.

Deep trench isolation structures 48 and 50 may be formed through the semiconductor material 16, N-type semiconductor layer 14 and the semiconductor substrate 12. In embodiments, the deep trench isolation structures 50 may extend through the shallow trench isolation structures 52. The deep trench isolation structures 48 may include an oxide liner **48*a* (on sidewalls) and a polysilicon fill material 48*b*. In embodiments, the polysilicon fill material 48*b* may be a p-doped polysilicon deposited by a conventional deposition process, e.g., CVD. The polysilicon fill material 48*b* will contact the semiconductor substrate 12, e.g., be tied to ground (GND). For example, the polysilicon material 48*b* provides an electrical path between the semiconductor substrate 12 and metal plates 46. By using the oxide liner 48*a*, it is possible to isolate the semiconductor material 16, e.g., thereby allowing the semiconductor material 16** to be floating, allowing the device to sustain a high breakdown voltage.

The deep trench isolation structures 50 may be filled with an oxide material using a conventional deposition process, e.g., CVD. Also, in embodiments, the deep trench isolation structures 50 may contact the drift region 18. The sidewall liner **48*a* and deep trench isolation structures 50** may have the same material.

Figure 2:
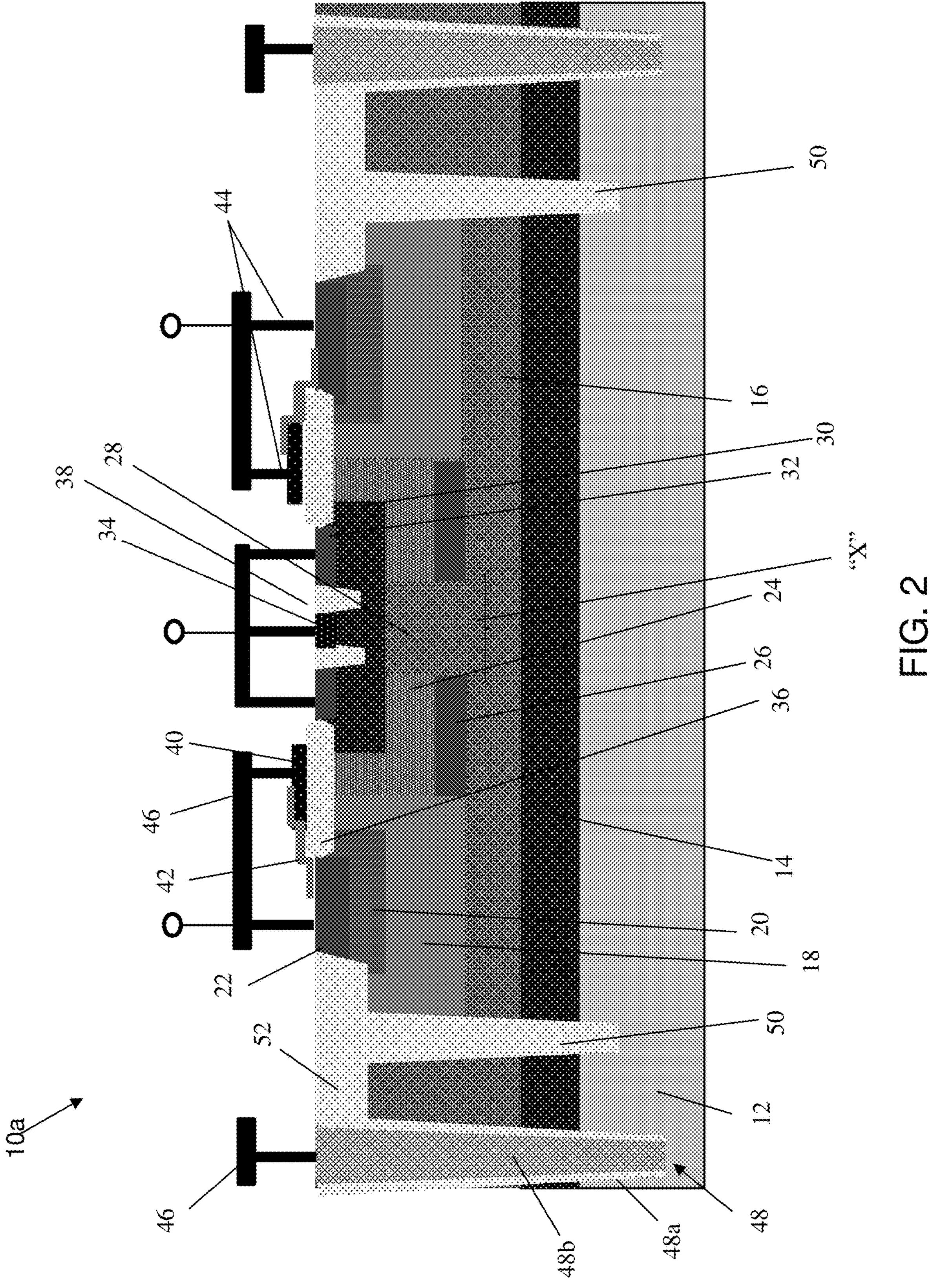
FIG. 2 shows an ESD protection device, amongst other features, in accordance with additional aspects of the present disclosure.

FIG. 2 shows an ESD protection device in accordance with additional aspects of the present disclosure. In the ESD protection device **10*a*, the base (e.g., the N-well 30) and the emitter (e.g., P+ diffusion regions 32) are directly shorted together without any external base resistor (thus providing lower conduction capability). The remaining features of ESD protection device 10*a* are similar to the structure 10 shown in FIGS. 1A and 1**B.

Figure 3:
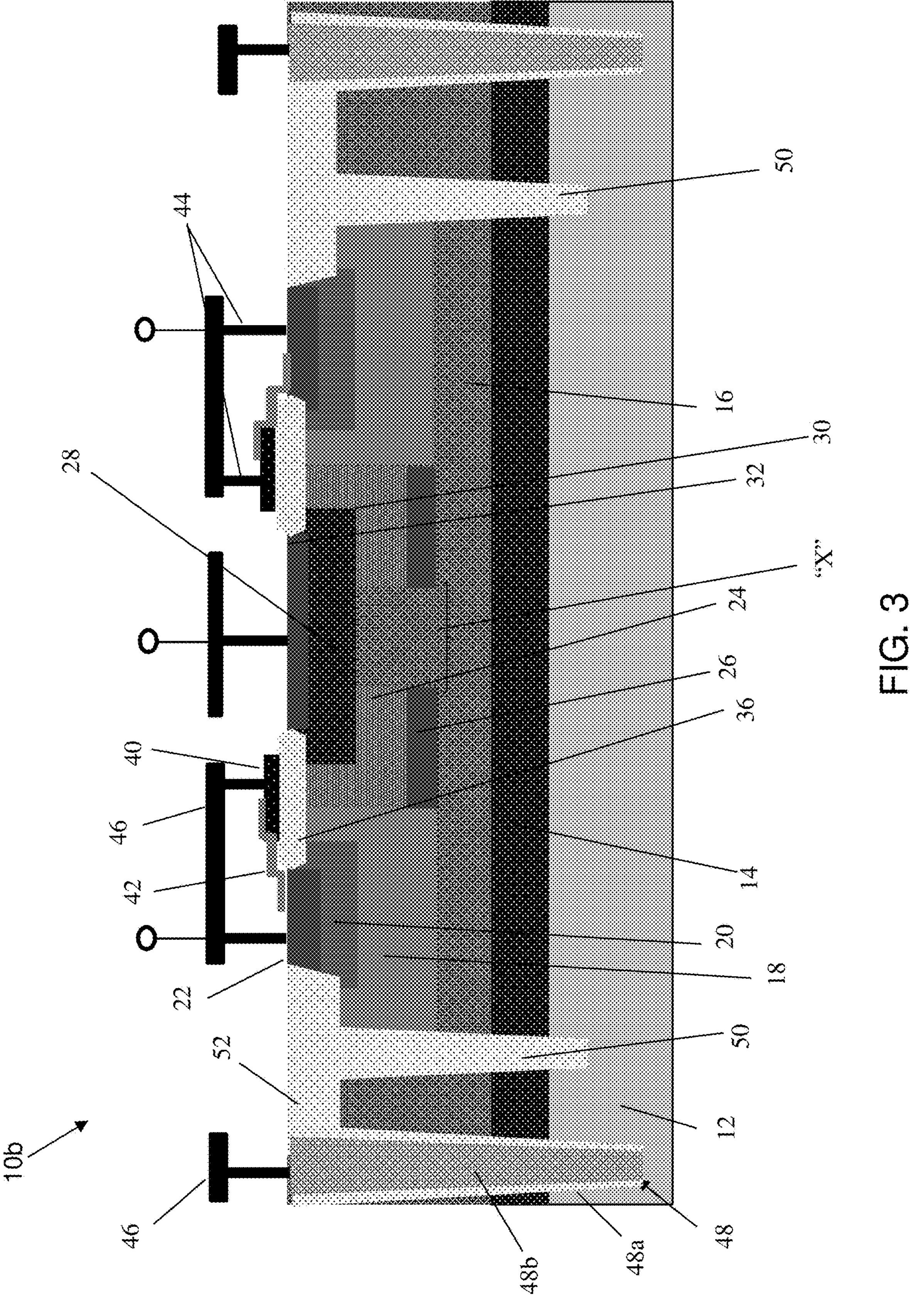
FIG. 3 shows an ESD protection device, amongst other features, in accordance with further aspects of the present disclosure.

FIG. 3 shows an ESD protection device in accordance with additional aspects of the present disclosure. In the ESD protection device **10*b*, the base (e.g., the N-well 30) has a floating design. More specifically, in the ESD protection device 10*b*, the N-well 30 does not have a contact and is floating; whereas the emitter includes a single, e.g., P+ diffusion region 32, with a contact. As the base is floating, the ESD protection device 10*b* does not require the N+ diffusions or shallow trench isolation structures separating the P+ diffusion regions 32 from the N+ diffusions. The remaining features of ESD protection device 10*b* are similar to the structure 10 shown in FIGS. 1A and 1**B.

Figure 4:
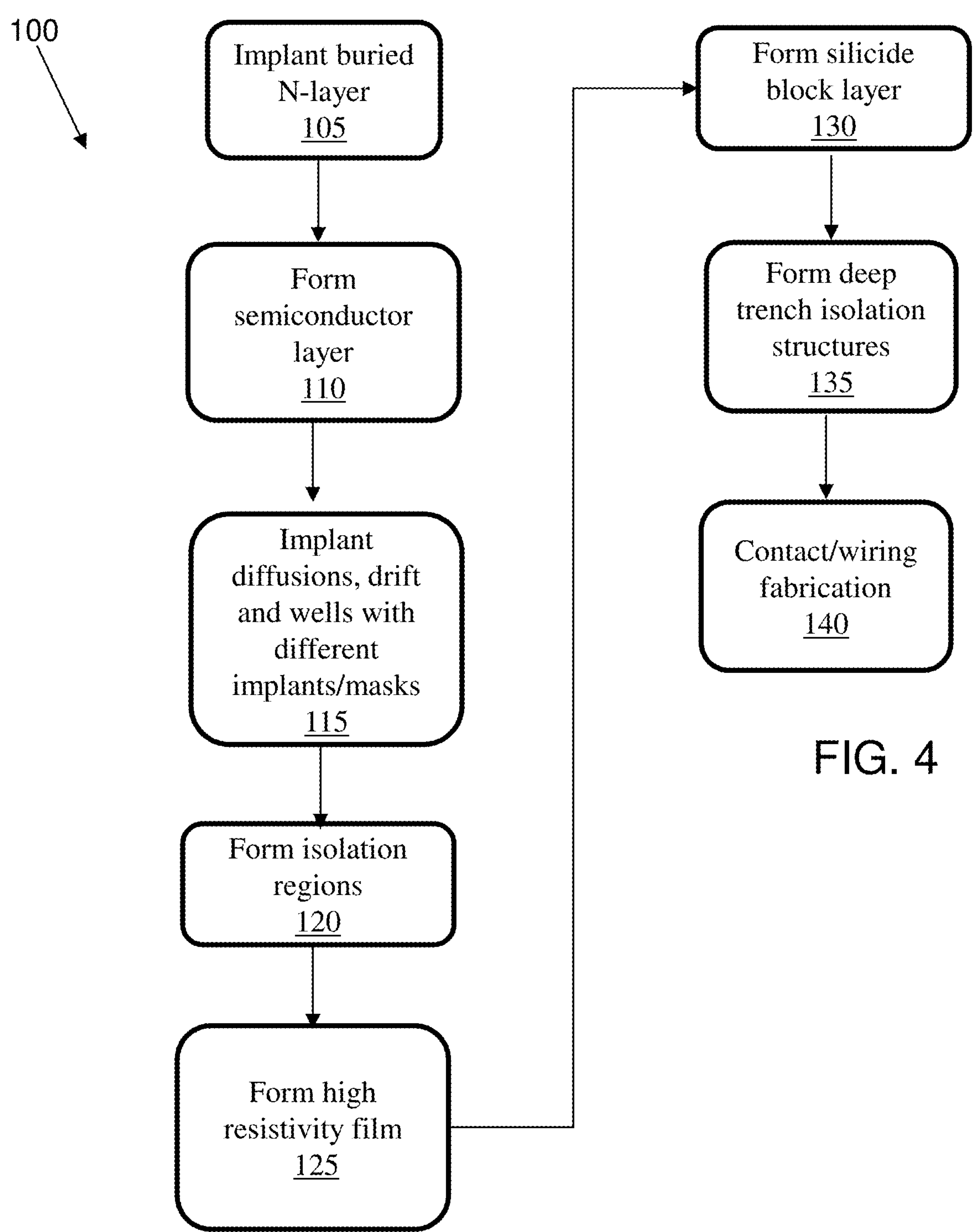
FIG. 4 shows a process flow representative of fabrication processes for manufacturing the devices of FIGS. 1A, 1B, 2 and 3.

FIG. 4 shows a process flow representative of fabrication processes 100 for manufacturing the devices of FIGS. 1A, 1B, 2 and 3. At step 105, the buried N-type layer 14 may be formed in the semiconductor substrate 12. In embodiments, the buried N-layer 14 may be formed by an ion implantation process as already noted with respect to FIGS. 1A and 1B.

At step 110, the semiconductor material 16 is epitaxially grown on the semiconductor substrate 12, over the buried N-layer 14. In embodiments, the epitaxial growth of the semiconductor material 16 may include an in-situ doping with N-type dopants, e.g., arsenic.

At step 115, diffusion regions, drift regions and buried implanted regions 18, 20, 22, 30, 32 and 34 may be formed using separate ion implantation processes with different masks as described herein and known in the art such that no further explanation is required for a complete understanding of the present disclosure. In these processes, respective patterned implantation masks may be used to define selected areas exposed for the implantations. The implantation mask used to select the exposed area for forming a single feature is stripped after implantation, and before the implantation mask used to form another feature as is known in the art.

At step 120, the isolation structures 36, 38 and 52 are formed in the semiconductor material 16. In embodiments, the isolation structures 36, 38 and 52 may shallow trench isolation structures formed by conventional lithography, etching and deposition methods as already described herein. The isolation structures 36 may also be formed by LOCOS processes as already described. In embodiments, the isolation structures 38 may be used to isolate the base from the emitter, as an example, within the N-well 30.

At step 125, the high resistivity film 40 (e.g., polysilicon field plate) may be formed on the insulator structure 36. In embodiments, the high resistivity film 40 (e.g., polysilicon field plate) may be formed by a conventional deposition process, e.g., CVD, followed by a conventional patterning process, e.g., lithography and etching process, as is known in the art.

At step 130, the silicide blocking layer 42 may be formed on the isolation structure 36, extending from a top surface of the high resistivity film 40 to a surface of the P+ diffusion region 22. The silicide blocking layer 42 may be a nitride or oxide material, formed by a conventional deposition process, e.g., CVD, followed by a conventional patterning process, e.g., lithography and etching process, as is known in the art.

At step 135, the deep trench isolation structures 48, 50 may be formed through the semiconductor material 16, N-type semiconductor layer 14 and the semiconductor substrate 12. The deep trench isolation structures 50 may be formed by conventional lithography and etching processes, followed by a deposition of insulator material, e.g., oxide using a conventional deposition process, e.g., CVD. The deep trench isolation structure 48 may also include a step of lining the deep trench isolation structure 48 with oxide material followed by anisotropic etching process to remove the insulator from a bottom of the trench. The remaining portion of the deep trench isolation structure 48 may be filled p-doped polysilicon material by a conventional deposition method.

At step 140, the contacts 44 and metal plates 46 may be formed using conventional lithography, etching and deposition processes. For example, the contacts 44 may be fabricated by forming a via in an interlevel dielectric material, following by deposition of metal material, e.g., tungsten, aluminum, copper, etc., and followed by a chemical mechanical polishing (CMP) process. The metal plates 46 may be formed in a manner similar to CMOS wiring layers, e.g., conventional deposition, lithography and etching processes as is known in the art such that no further explanation is required herein for a complete understanding of the present disclosure.

The electrostatic devices can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprises:

a device comprising a collector, an emitter, and a base;

an isolation structure extending between the base and the collector;

a high resistivity film over the isolation structure;

a silicide blocking layer partially covering the high resistivity film, the isolation structure and the collector; and a P-drift region which surrounds the collector and a first deep trench isolation structure touching the P-drift region.

2. The structure of claim 1, wherein the collector and emitter comprise P+ diffusion regions and the base comprises an N-well.

3. The structure of claim 1, wherein the high resistivity film and the collector are connected by a plate.

4. The structure of claim 3, wherein the high resistivity film comprises a polysilicon material on the isolation structure.

5. The structure of claim 1, wherein the base and the emitter are connected with a base resistor.

6. The structure of claim 1, wherein the base is floating.

7. The structure of claim 1, wherein the isolation structure comprises a local oxidation of silicon.

8. The structure of claim 1, further comprising a second deep trench isolation structure comprising a lining material and filled polysilicon material.

9. The structure of claim 8, wherein the polysilicon material comprises P-doped polysilicon.

10. The structure of claim 8, wherein the second deep trench isolation structure extends to an underlying substrate beneath an N+ buried layer.

11. A structure comprising:

a device comprising a collector, an emitter, and a base;

an isolation structure extending between the base and the collector;

a high resistivity film over the isolation structure;

a silicide blocking layer partially covering the high resistivity film, the isolation structure and the collector; and an N-type drift region and a P+ buried layer under the N-type drift region, the N-type drift region and the P+ buried layer having a gap between sides filled with a semiconductor material, and the emitter spans the gap.

12. A method comprises:

forming a device comprising a collector, an emitter, and a base;

forming an isolation structure extending between the base and the collector;

forming a high resistivity film over the isolation structure;

forming a silicide blocking layer partially covering the high resistivity film, the isolation structure and the collector; and forming a P-drift region which surrounds the collector and a first deep trench isolation structure touching the P-drift region.

* * * * *